United States Patent [19]

Baumecker et al.

[11] Patent Number: 6,132,562
[45] Date of Patent: Oct. 17, 2000

[54] METHOD AND DEVICE FOR TRANSPORTING CYLINDRICAL SUBSTRATES TO BE COATED

[75] Inventors: Tomas Baumecker, Bruchköbel; Helmut Grimm, Darmstadt; Jürgen Henrich, Limeshain; Klaus Michael, Gelnhausen; Gert Rödling, Obertshausen; Jürgen Ulrich, Schöneck, all of Germany

[73] Assignee: Leybold Systems GmbH, Hanau, Germany

[21] Appl. No.: 09/249,444

[22] Filed: Feb. 12, 1999

[30] Foreign Application Priority Data

Feb. 19, 1998 [DE] Germany .............. 198 07 032

[51] Int. Cl.⁷ .................... C23C 14/22; C23C 14/56; C23C 14/34; B65G 49/00
[52] U.S. Cl. .................. 204/192.12; 204/298.02; 204/298.15; 204/298.26; 204/298.27; 204/298.28; 204/298.23; 204/192.1; 204/192.15; 204/192.23; 118/715; 118/720; 118/728; 118/729; 118/723 VE; 118/723 R; 118/730; 118/731; 427/255.5; 427/569; 427/574; 427/578; 427/481; 427/471
[58] Field of Search .............. 204/298.02, 298.15, 204/298.26, 298.27, 298.28, 298.23, 192.1, 192.12, 192.15, 192.23; 118/715, 720, 728, 729, 730, 731, 723 VE, 723 R; 427/255.5, 569, 574, 578, 481, 471

[56] References Cited

U.S. PATENT DOCUMENTS

| | | | |
|---|---|---|---|
| 2,816,523 | 12/1957 | Johnson | 204/298.27 |
| 2,878,143 | 3/1959 | Juvinall | 427/481 |
| 3,516,811 | 6/1970 | Gatchet . | |
| 3,688,737 | 9/1972 | Augustsson et al. . | |
| 4,151,059 | 4/1979 | Kuehnle | 204/298.27 |
| 4,529,627 | 7/1985 | Zurbig | 427/255 |
| 4,781,205 | 11/1988 | Shakley . | |
| 4,886,592 | 12/1989 | Anderle et al. | 118/719 |
| 4,969,790 | 11/1990 | Petz et al. | 414/217 |
| 5,611,858 | 3/1997 | Zejda | 118/50 |

FOREIGN PATENT DOCUMENTS

| | | |
|---|---|---|
| 0354294 | 2/1990 | European Pat. Off. . |
| 1152323 | 2/1964 | Germany . |
| 1556716 | 2/1970 | Germany . |
| 3226900 | 1/1984 | Germany . |
| 3735284 | 4/1989 | Germany . |
| 4341634 | 6/1995 | Germany . |
| 29708315 | 8/1997 | Germany . |
| 198 07 032 | 2/1998 | Germany . |

*Primary Examiner*—Alan Diamond
*Attorney, Agent, or Firm*—Smith, Gambrell & Russell, LLP

[57] ABSTRACT

For coating substrates (17,18,20,21,22) in a vacuum-coating chamber (2) the substrates are introduced by an air lock into the coating chamber (2) and moved along a transport path in front of the coating sources (50a,b,c,d) producing a coating cloud. To this end, the substrates (17,18,20,21,22) are led past the coating sources (50a,b,c,d) by means of holding devices (24) arranged movably on a transport belt (9) during at least two successive coating phases. During the one coating phase, the substrates (17,18,20,21,22) are oriented along one transport direction $T_3$ oriented towards the coating sources (50a,b,c,d) such that essentially the substrate bottom of the cylindrical substrate is coated. During the subsequent second coating phase, the substrates are oriented in front of the coating sources (50a,b,c,d) in a direction $T_4$ opposite the transport direction $T_3$, wherein the substrates (17,18,20,21, 22) are oriented such that essentially the cylindrical side surface is coated. By this method, the substrates (17,18,20, 21,22) are coated successively in an identical manner and independently of possible substrate positions with relation to the coating sources (50a,b,c,d) during the coating process. Bottle-shaped containers, in particular, plastic bottles are vapor-coated with a gas- or fluid-barrier layer using the method. The coating sources (50a,b,c,d) include thermal vaporizers and/or plasma cathode sputter sources.

24 Claims, 8 Drawing Sheets

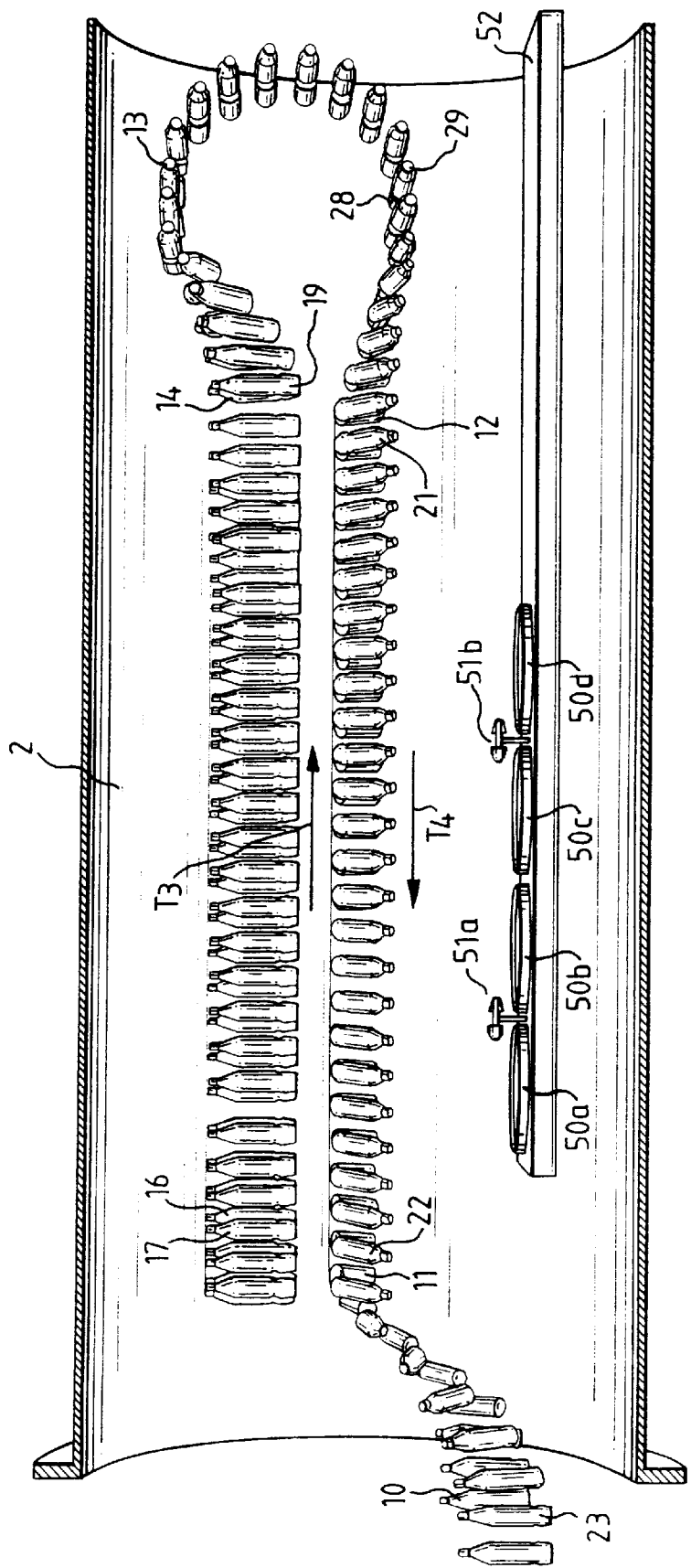

METHOD AND DEVICE FOR TRANSPORTING CYLINDRICAL SUBSTRATES TO BE COATED

INTRODUCTION AND BACKGROUND

The present invention pertains to a method and a device for uniform coating of cylindrically shaped substrates with coating material that is deposited from a material cloud of material onto the substrates, wherein the substrates to be coated are brought into the environment of the material cloud.

Coating methods of this general class are known, for instance, for the application of optically active layers onto optical elements. In these methods, the substrate to be coated is positioned inside a vacuum-coating chamber in front of a coating source. The material that forms the layer is emitted from the coating source as a material cloud is deposited on the surfaces of the substrate facing the coating source. In order, for instance, to coat the aforementioned optical glasses on both sides, it is necessary to interrupt the coating process, turn the substrates 180° and then continue the coating process. In the customary methods, the coating process of multi-surface substrates takes place successively for each substrate surface, the coating chambers having to be reopened each time to reposition the substrates in front of the coating sources. For this purpose the coating chambers must be ventilated or again evacuated for the performance of the subsequent coating process, which makes the known methods time-consuming and cost-intensive, particularly for coating a large series of identical substrates.

It is therefore an object of the invention to provide a method of the type described above in which the coating of a large series of substrates having a multi-planar surface is made possible without the need for interruption of the coating process for the purpose of repositioning the substrate surfaces to be coated.

It is a further object of the present invention to provide a device for coating substrates, by means of which the method of the invention can be implemented.

SUMMARY OF THE INVENTION

The above and other objects of the present invention can be accomplished by bringing the substrates to be coated into the material cloud for deposition of the layer material, wherein the coating process comprising at least two temporally successive coating phases forming a coating cycle. It is a feature of the invention that during one, preferably the first, coating phase, the individual substrate is oriented spatially with respect to the material cloud such that essentially its cylindrical outer surface is coated.

It is a further feature of the invention that during the other, preferably the second, coating phase, the substrate is oriented spatially in front of a coating source such that essentially at least one cylindrical bottom of the substrate is coated.

Due to the different orientation of the substrate during the two coating phases, the substrate is uniformly covered with a cohesive surface layer. The first and the second coating phases take place in immediate succession in the coating chamber, without the coating chamber being ventilated for repositioning the substrates between the two coating phases. In the method according to the invention, a complete coating of the substrate is thus advantageously accomplished in the shortest possible time, whereby the entire coating process can be economically performed. This advantage is of particular significance if a large number of substrates is to be coated.

The method according to the invention proves to be particularly economical by coating the substrates during the first and the second coating phase with the same coating source. This has the advantage that only one coating source is needed, which makes the method economical.

According to another detailed aspect of the invention, the substrates are moved along in front of the coating source or sources at a constant distance from the coating source or sources during the coating cycle. It is guaranteed by this measure that each individual substrate is exposed to the material cloud in the same manner and that the layer deposition on the substrates is not dependent on different positions of the substrates in relation to the coating source or sources. In particular, since the emission of the material cloud from the coating source does not take place isotopically, different layer thickness which can be a consequence of the spatial density differences in the material cloud are advantageously completely equalized by this feature.

It is a further feature of the present invention to interchange the first coating phase with the second coating phase, whereby the coating sequence of the method according to the invention can be handled flexibly in the desired manner.

The substrates are moved in front of the coating source or sources by means of a transport belt, on which individual substrate-holding devices, each with individual pivoting gripping devices, are provided, preferably spaced equidistantly one from the other. The transport belt extends over a transport path, along which the substrates are transported. By means of the pivoting gripping devices, the spatial position of the substrates in relation to the coating source is adjusted as a function of the coating position and/or the transport path of the substrates.

Using an endless transport belt which extends along an enclosed transport path that turns back on itself is envisioned as the transport belt. The transport path of the substrates in the coating chamber is selected such that the substrates pass through the material cloud in the one coating phase in the opposite transport direction to the transport direction of the substrates during the associated other coating phase. This measure ensures that the vaporization beam of the material cloud is effectively utilized since the spatial arrangement of the substrates can be adapted to the spatial extension of the beam shape of the material cloud deposits exclusively on the substrates to be coated and not on other surfaces in the coating chamber. With this measure, an effective utilization and material consumption of the reservoir of coating material present in the coating source is achieved.

The opposite orientation of the transport path during the different transport phases also permits a compact arrangement of the transport belt and thus advantageously a compact spatial construction of the coating chamber.

For depositing several or single thicker layers it is proposed to subject the substrates in the same vacuum-coating chamber to immediately successive coating cycles.

In order to form the layer thicknesses optimally on the substrates as a function of the substrate surfaces to be coated, the substrates are arranged during one, preferably the second, coating phase in a different spacing from the coating source and on the side turned away from the coating source of the substrates undergoing the other, preferably the first, coating phase. Based on the distance-dependent density of the material cloud, the coating material is deposited at a differing distance-dependent rate on the substrate, whereby layers of different thickness are produced in the desired manner.

The layer thicknesses on the different substrate surfaces can also be adjusted with the process characteristics by shielding the substrates during the one coating phase in part by the substrates passing through the other coating phase. According to the degree of agreement set, the effective coating times and thus the layer thicknesses can thus be selected for the different coating surfaces of the substrate.

With the method according to the invention, it is possible to deposit layers having $SiO_2$ on individual substrates. Such $SiO_2$-containing layers, typically between 20 nm and 200 nm thick, are optically transparent and act as barriers to the passage of gaseous or liquid substances. Such layers are produced with the present method, for instance, by means of vaporization sources and/or sputter cathode sources. Such barrier layers are preferably deposited onto plastic substrates, in particular, plastic containers which serve, for instance, as bottles containing beverages. PET and polycarbonate containers are widely used in the industry. With the barrier layer, gases dissolved in the beverage liquid such as $CO_2$ can be prevented from escaping from the container volume.

In order to conduct the method, a device of the present invention comprises at least one coating chamber, preferably a vacuum-coating chamber, as well as a coating source. In the vacuum-coating chamber, a transport belt, preferably an endless transport belt, is arranged for transporting the substrates along a transport path. The substrates conveyed along the transport path by the transport belt on mounting devices are moved through a material cloud produced by the coating source. The transport belt travels through the material cloud with one, preferably a first, coating phase in an advance direction, where the substrates are oriented with their surface to be coated towards the coating source. For coating additional substrate surfaces, the substrates are oriented with respect to the coating source during the other, preferably a second, coating phase while passing through the transport path such that the layer material precipitates essentially on this side. In this case, the substrate passes through a transport path opposite to the transport path of the first coating phase.

BRIEF DESCRIPTION OF DRAWINGS

The present invention in its several aspects will be understood in greater detail with reference to the embodiment illustrated in the accompanying drawings, wherein:

FIG. 8 is a perspective view of the transport path of the substrates in the coating chamber cut open in the longitudinal direction.

DETAILED DESCRIPTION OF INVENTION

The present invention will now be described in further detail with reference to the drawings.

Figure 1:
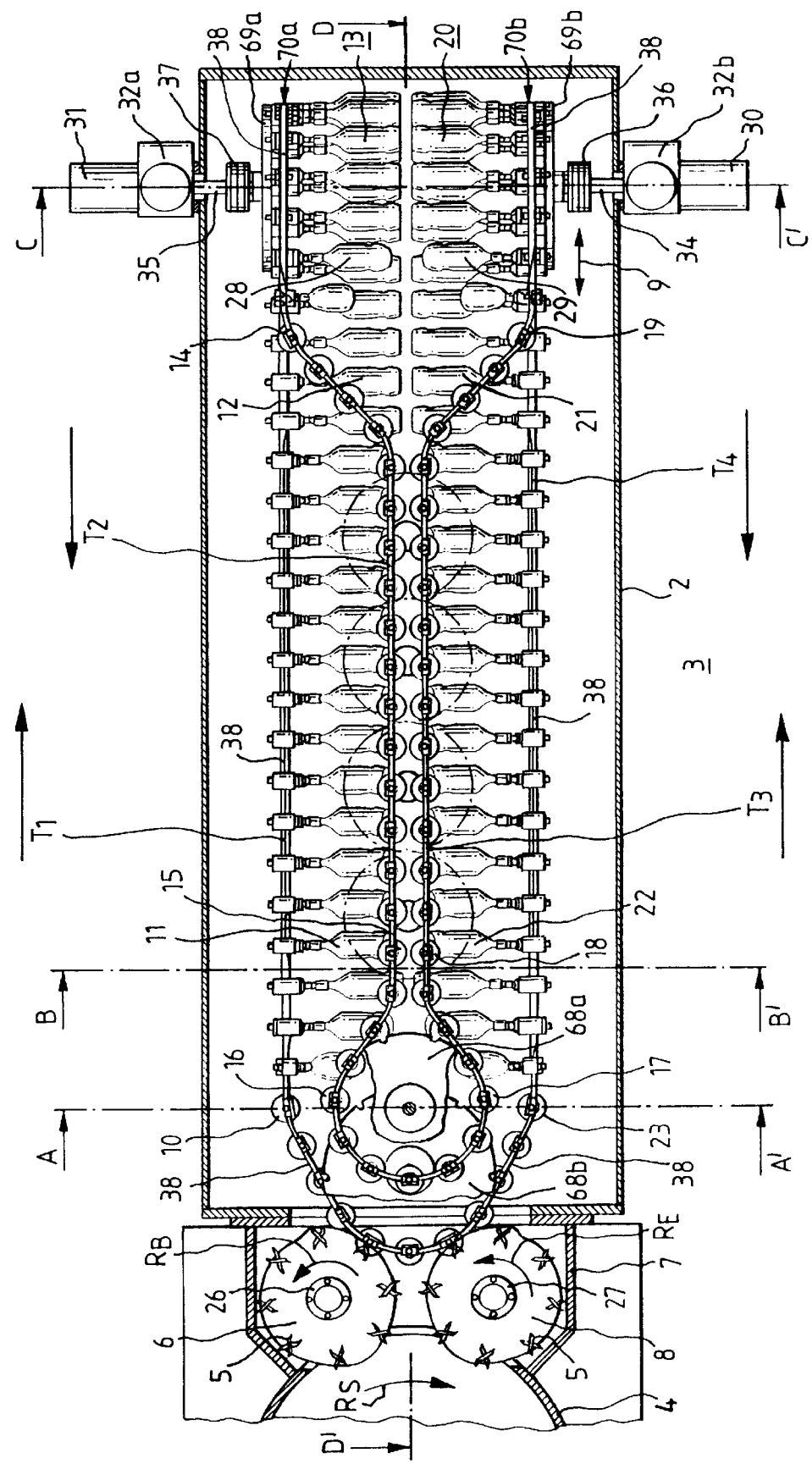
FIG. 1 is a horizontal longitudinal sectional view through a coating chamber for coating substrates with associated lock and transfer chamber.

The coating device illustrated in FIG. 1 for coating cylindrical substrates 10–23,28,29 consists in essence of a coating chamber 2 and a transfer chamber 7 arranged at its upper end, through which the substrates to be coated 10–23, 28,29 are transported via an air lock 4 into the coating chamber 2. The interior of the coating chamber 2 can be pumped down to a maximum negative pressure of $10^{-3}$–$10^{-6}$ typical of vacuum-supported coating processes by means of a conventional vacuum pump arrangement not shown in the drawings by way of vacuum connectors on the coating chamber. The pressure difference between the exterior 3, having a higher pressure, for instance, normal pressure, and the interior of the coating chamber 2 is maintained by way of the atmospherically sealing lock chamber 4. The substrates 10–23,28,29 to be coated are continuously supplied in the air lock 4 in, preferably individual, lock chambers, not shown, in the rotational direction $R_S$ to the removal device 6, which removes the substrates from the lock chambers.

In the removal device 6, several grippers 5 rotating about an axis 26 in the rotational direction $R_B$ are arranged. The rotational velocity of the individual grippers 5 also corresponds to the rotational velocity of the substrates 10–23,28, 29 supplied in the air lock 4. The substrates 10–23,28,29 are seized by the grippers 5 and brought out of the lock chambers. Subsequently, the substrates 10–23,28,29 are transferred into the transport path of a transport belt 9, after rotation of the grippers 5 by 180° in the rotational direction $R_B$ about the axis 26 (see FIGS. 2–4).

On the transport belt 9, constructed by way of example in the form of a rail, individual roller carriages 25 joined to one another by a transport chain 38 are arranged so as to be able to move. A transport closure 24 in which the substrates 10–23,28,29 are held is connected to each roller carriage 25. These transport closure devices 24 serve to close, for instance, the openings of the bottle-shaped substrates 10–23, 28,29 in order to prevent an elevation of the negative pressure in the coating chamber 2 due to air introduced in the containers into the coating chamber 2 and the escape of air therein. The substrates 10–23,28,29 inserted into the transport closure devices 24, are first moved on the transport belt 9 in the transport direction $T_1$ parallel to the coating sources 50$a,b,c,d$ arranged in the coating chamber 2 (see FIGS. 1,5,6).

Figure 2:
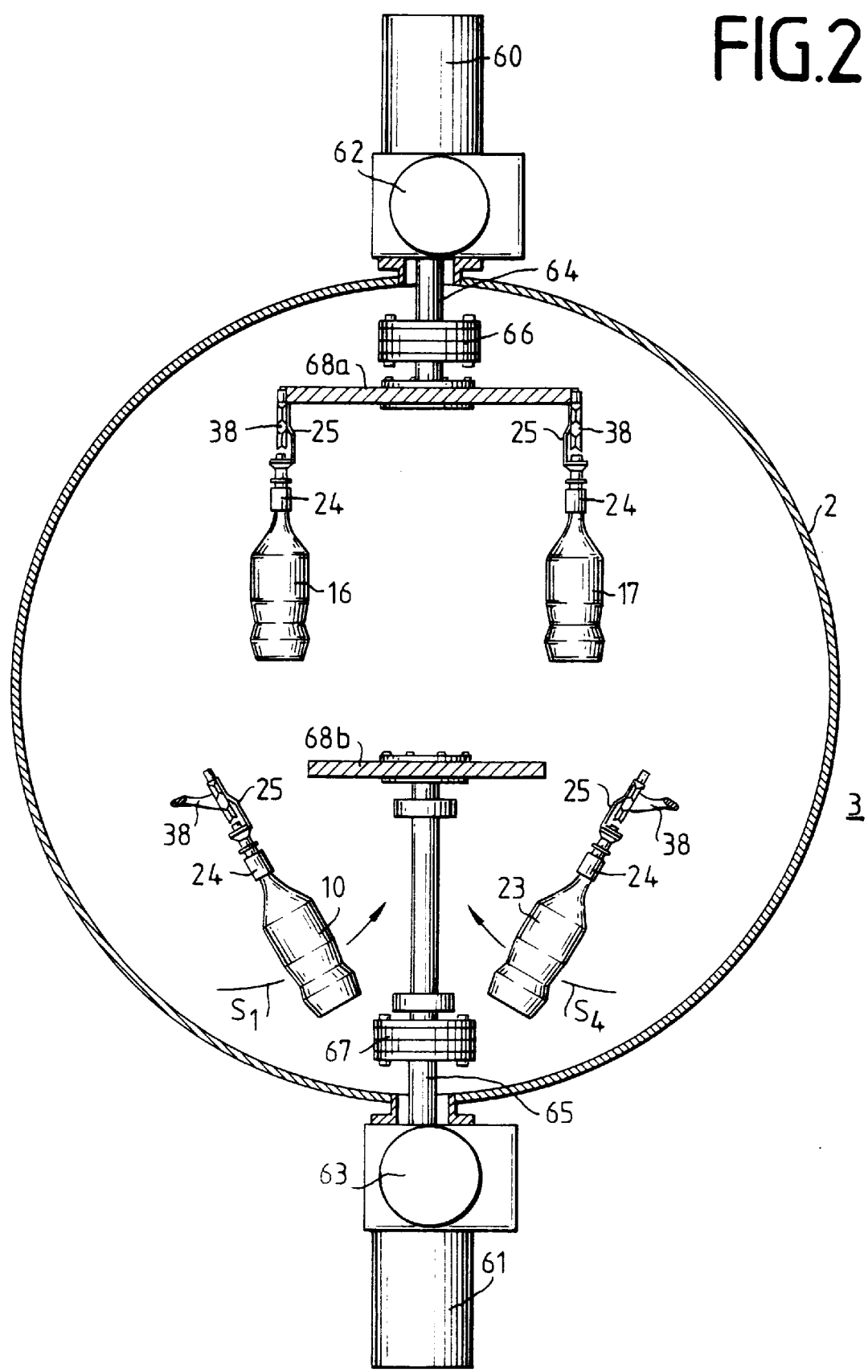
FIG. 2 is a cross-sectional view along section line A–A' in FIG. 1.
Figure 3:
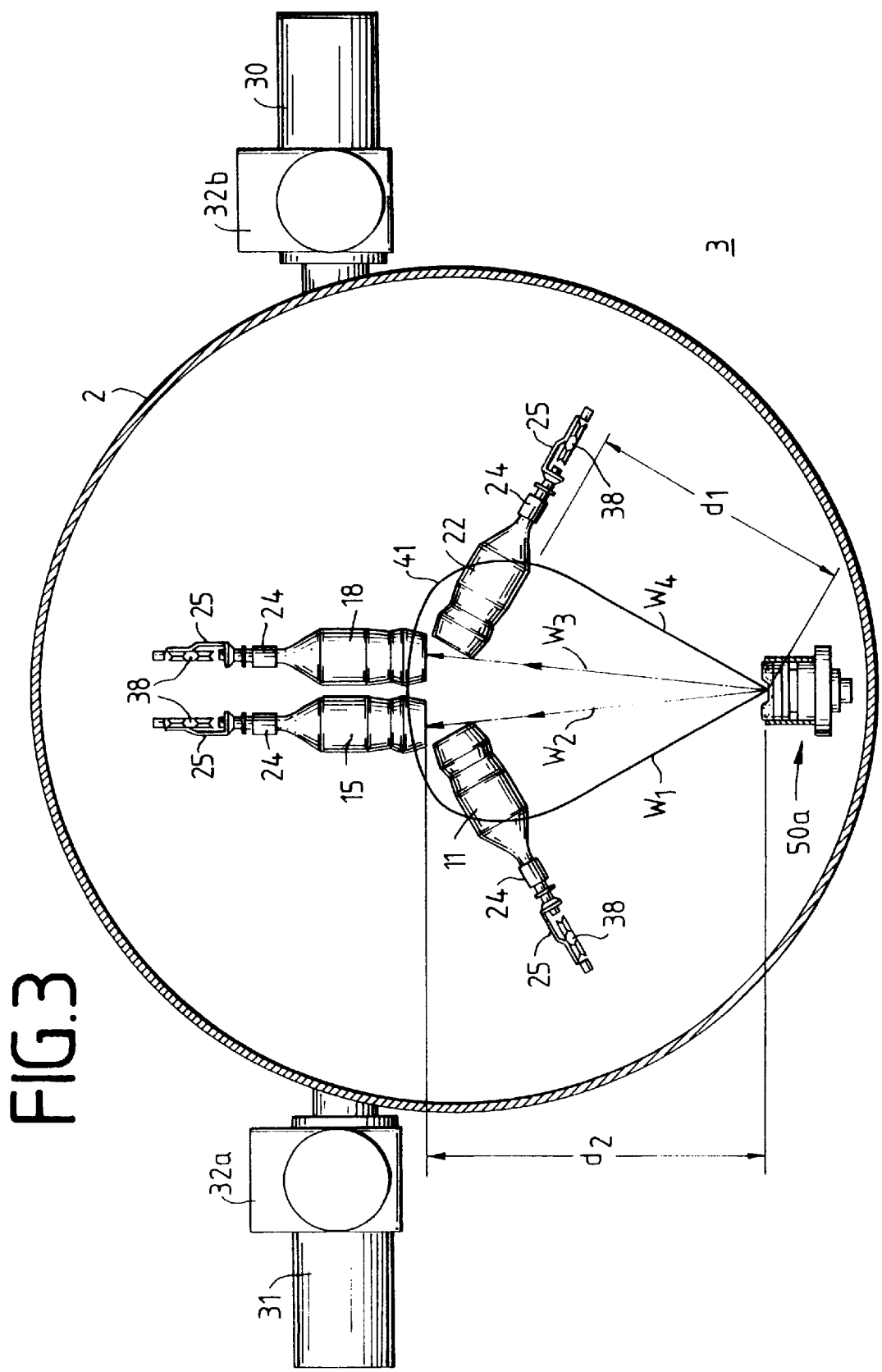
FIG. 3 is a cross-sectional view along section line B–B' in FIG. 1.
Figure 4:
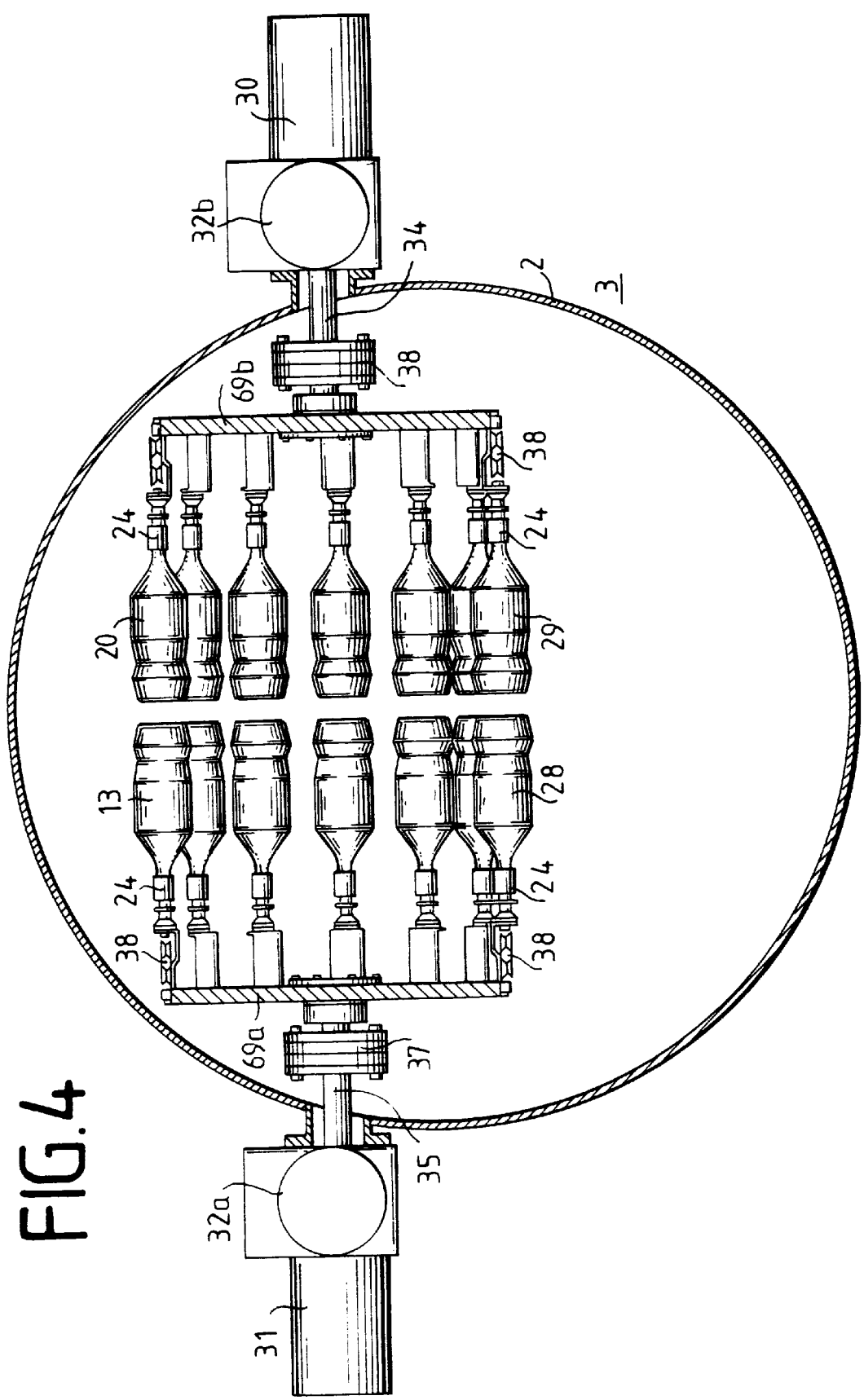
FIG. 4 is a cross-sectional view along section line C–C' in FIG. 1.
Figure 7:
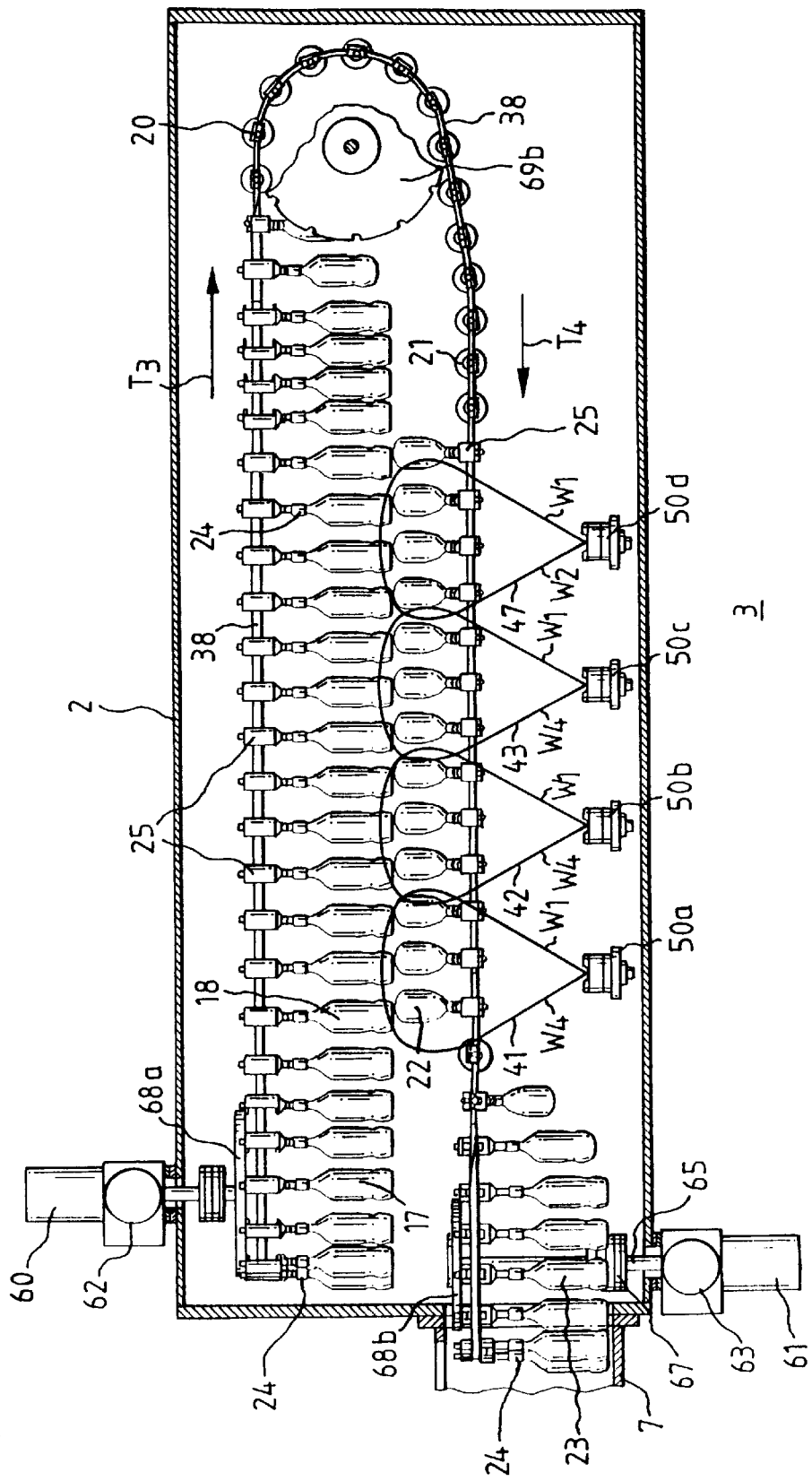
FIG. 7 is a longitudinal sectional view along section line D–D' in FIG. 1.

In the process, the substrates 10–23,28,29 produced by the coating sources 50$a,b,c,d$ move through the material clouds 41,42,43,47, which, as illustrated in FIGS. 3 and 7, are shaped essentially as individual but overlapping vaporization lobes having a spatial extension along the trajectories $W_1,W_2,W_3,W_4$. As can be derived from FIGS. 2,3,4,7,8, the transport belt 9 passes through the coating chamber 2 in two horizontally running planes, the transport directions $T_1,T_2$, $T_3,T_4$ reversing inside the same transport plane over the longitudinal direction of the coating chamber 2. During the entire coating process, a substrate to be coated 10–23,28,29 produced by the coating sources 50$a$, $b$, $c$, $d$ runs through four transport directions, namely $T_1$ and $T_3$ of identical direction and as well as the oppositely directed $T_2$ and $T_4$ in the direction sequence $T_1$-$T_2$-$T_3$-$T_4$.

Figure 5:
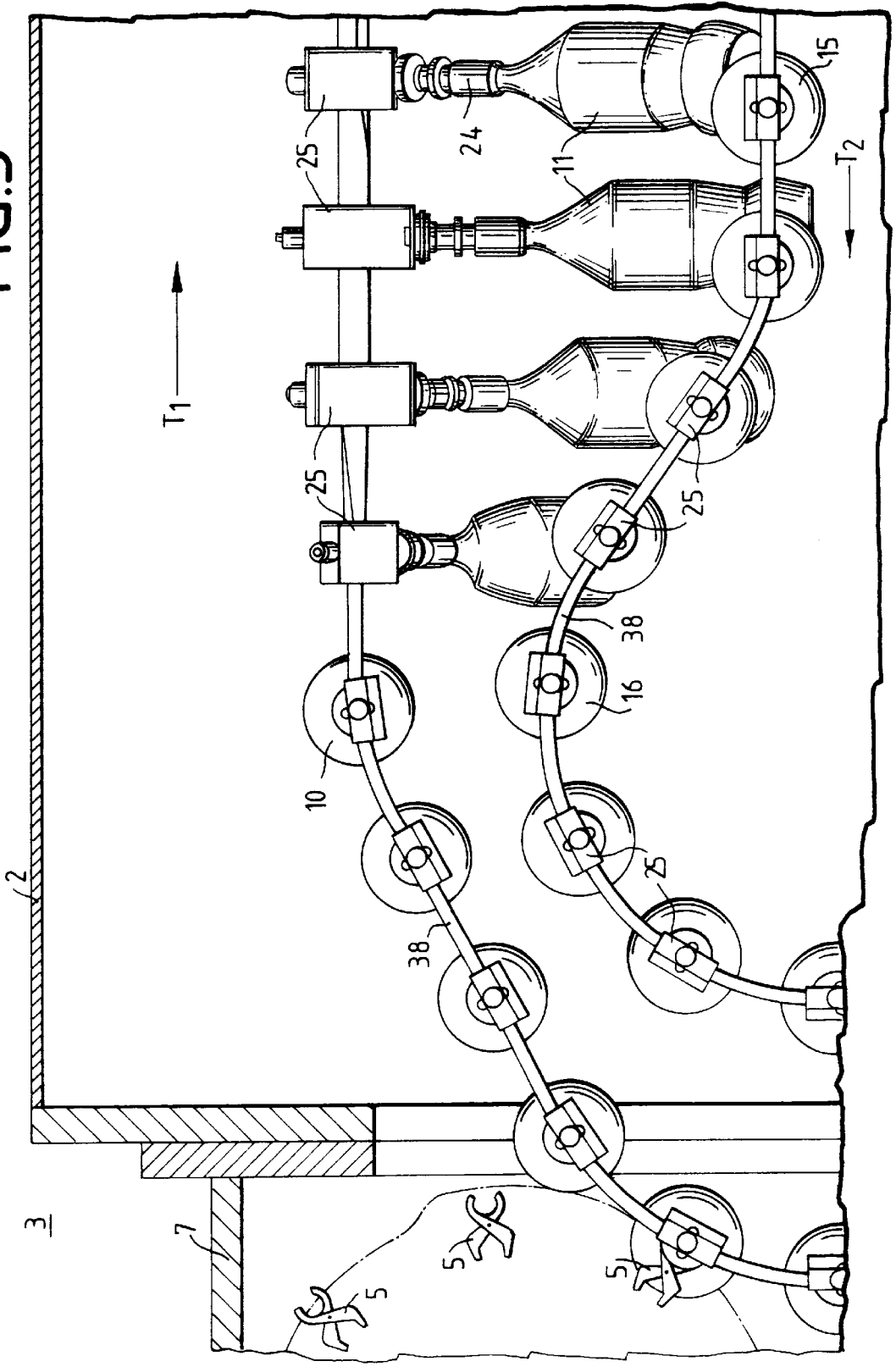
FIG. 5 is a partial cutout view of the coating chamber illustrated in FIG. 1, with transfer chamber in an enlarged representation.
Figure 6:
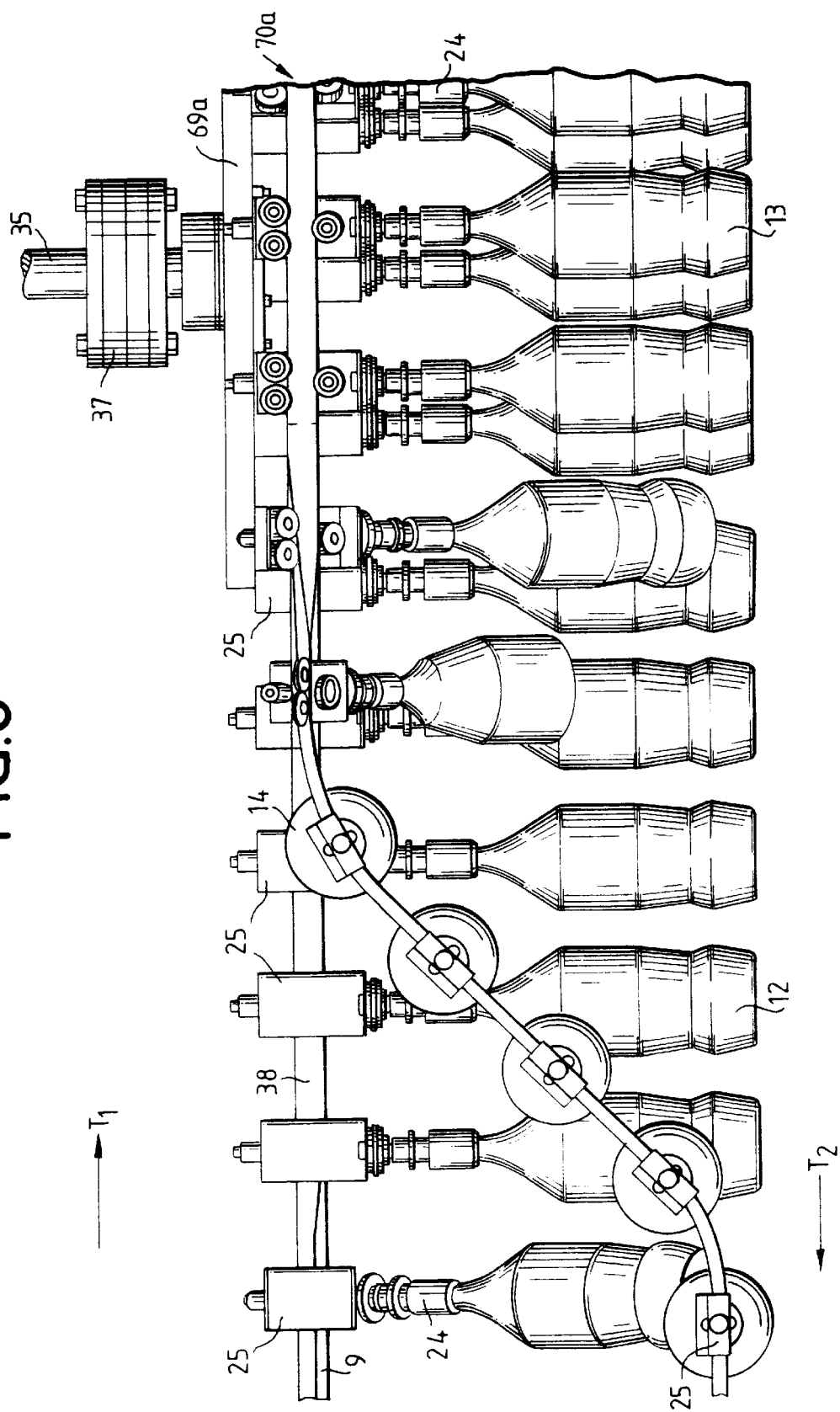
FIG. 6 is a partial cutout view of the coating chamber illustrated in FIG. 1, with turnaround station in an enlarged representation.

For the sake of example, the transport path of a single substrate 10, which is illustrated in FIGS. 1, 2 and 5, will be traced. In this case the substrate 10 is first pivoted by means of the pivoting transport closures by about 120° counterclockwise, in the plan view of FIG. 2, in pivot direction $S_1$. In this vapor-coating position illustrated in FIGS. 3 and 7, the substrate 11 passes through the coating chamber 2 in the longitudinal direction, the substrate 11 being essentially oriented with its lateral area facing the coating sources 50*a,b,c,d* (see FIGS. 3,7,8). The coating lobe extending between the trajectories W$_1$ and W$_2$ (see FIGS. 3 and 7) covers the substrate 11 and coats it almost exclusively on the lateral area. In order to guarantee a homogeneous all-round coating of the substrate 10–23,28,29 on the entire transport path 9, the substrates 10–23,28,29 are rotated during the entire coating cycle about their longitudinal axes, whereby the container periphery is uniformly oriented toward the coating sources 50*a,b,c,d*.

After the conclusion of this first coating phase along the transport direction T$_1$, the substrate 12, now coated exclusively in the lateral area, is pivoted from its 120° position into a horizontal position (see FIG. 4) and the transport path T$_1$ is diverted via a turning device (31,32*a*,37,69*a*,70) in the opposite direction T$_2$. Subsequently, the horizontally positioned substrates 13 are transferred into a vertical substrate position 14,15. The substrates 14,15 are now oriented with their bottom surface to be coated towards the coating sources 50*a,b,c,d*, whereby the layer material precipitates essentially on the substrate bottom. The transport path T$_2$ of this second coating phase leads to a 360° turning station with a cylindrical lantern gear 68*a*, in which the substrates 16,17 (see FIGS. 1, 2) are fed to a third coating section with a transport direction T$_3$, which initiates a second coating cycle.

In this third coating section, the substrates 18,21 pass through the transport path in the transport direction T$_3$ and are transported in the process parallel to the substrates 14,15 passing through the second coating section and substrate bottoms are coated.

Following the third coating phase, the substrates 10–23, 28,29 are again reversed in direction of motion by way of a second turning device 30,32*b*,34,36,69*b*,70*b*. At the same time, the substrates, as illustrated in FIGS. 5 and 7, are pivoted out of their vertical position into the 120°-angled position in order again to expose the substrate 21,22 with their lateral surfaces to the coating sources 50*a,b,c,d*. Following this fourth coating phase, the now completely coated substrates 22,23 are fed to the air lock 8 in the transfer chamber 7. Analogously as in the removal of the substrates 10–23,28,29 from the lock chambers, the substrates are conveyed by means of grippers 5 from the transport belt 9 into the lock chambers of the air lock 4 and transferred by means of the latter in the atmospheric exterior 1. The entire transport of the substrates and the coating process run continuously.

The transport belt 9 is driven at each of the four turning stations by a drive wheel 68*a*,68*b*,69*a*,69*b* arranged concentrically to a deflection wheel and turned via a drive shaft 34,35,64,65 having a clutch 36,37,66,67 which is driven by a motor 30,31,60,61 via a gear assembly 32*a*,32*b*,62,63. The drive wheels 68*a*,68*b*,69*a*,69*b* are preferably constructed as cylindrical lantern gears which interact with corresponding advance elements fastened to the transport belt 9.

The drive units of the transport belt 9 are provided mutually axially parallel and opposing one another in relation to the longitudinal planes of symmetry of the coating chamber 2 in the respective turning units arranged at the ends in the coating chamber 2.

Further variations and modifications of the foregoing will be apparent to those skilled in the art and are intended to be encompassed by the claims appended hereto.

German priority application 198 07 032.2 is relied on and incorporated herein by reference.

We claim:

1. A method for coating a plurality of cylindrical substrates, comprising providing at least one coating source which produces a material cloud containing a coating material, bringing said substrates to be coated into the material cloud and depositing said coating material on said substrates, there being at least two temporally successive coating phases forming a coating cycle, wherein:

during one of the said coating phases, a first substrate is spatially oriented in a first orientation with respect to the coating source such that essentially a cylindrical lateral surface of the first substrate is coated; and during the other of said coating phases, the first substrate is spatially oriented in a second orientation with respect to the coating source such that a cylinder bottom of the first substrate is coated with the coating material, the first orientation differing from the second orientation, whereby a cohesive surface layer is deposited on the first substrate.

2. The method according to claim 1, further comprising orienting said substrates during the one coating phase essentially with their lateral surface towards the coating source and, during the other coating phase, orienting the substrates with the cylinder bottom to be coated towards the coating source and coating said substrates by the same coating source.

3. The method according to claim 1, further comprising moving the substrates along in front of the coating source at a first constant spacing from the coating source during the one coating phase, and at a second constant spacing from the coating source during the other coating phase, each substrate passing through the material cloud in the same manner.

4. The method according to claim 3, wherein the first constant spacing during the one coating phase differs from the second constant spacing during the other coating phase.

5. The method according to claim 1, wherein the one coating phase is interchanged with the other coating phase.

6. The method according to claim 1, further comprising moving the substrates in front of the coating source during the coating phases by a transport belt on which there are individual holding devices for accommodating individual substrates, and wherein the transport belt extends along a transport path.

7. The method according to claim 6, wherein said belt is an endless belt.

8. The method according to claim 6, wherein said holding devices are spaced equidistant.

9. The method according to claim 6 wherein said holding devices individually pivot as the transport belt moves along the transport path.

10. The method according to claim 1, further comprising transporting the substrates in a first transport direction during the one coating phase, and transporting the substrates in a second transport direction during the other coating phase, wherein the first transport direction is opposite the second transport direction.

11. The method according to claim 1, wherein the method comprises at least two immediately successive coating cycles in a single vacuum-coating chamber.

12. The method according to claim 1, wherein during the one coating phase, the substrates are arranged on a side of the coating source facing away from the substrates passing through the other coating phase.

13. The method according to claim 1, wherein a free line-of-sight connection between the coating source and the substrates passing through the one coating phase is partially shielded by the substrates passing through the other coating phase, whereby simultaneously some substrates are coated on their cylindrical side surfaces and other substrates are coated on their substrate bottom.

14. The method according to claim 1, wherein a barrier layer, impermeable to the passage of gaseous and/or liquid substances is deposited on the substrates.

15. The method according to claim 14, wherein said barrier layer contains $SiO_2$.

16. The method according to claim 1, wherein the coating source is at least one of a vaporization source or a sputter cathode source.

17. The method according to claim 6, wherein the transport path turns back on itself.

18. A device for coating a plurality of cylindrical substrates comprising:

a coating chamber in which at least one coating source is arranged; and a transport belt for transporting substrates, wherein the transport belt is arranged spatially with respect to the coating source such that, during two temporally successive coating phases, a cohesive surface layer is deposited from a material cloud produced by the coating source onto the substrates held on the transport belt, and wherein the substrates are oriented during a first coating phase essentially with their cylindrical side surface facing the coating source, and during a second coating phase with at least one cylinder bottom facing the coating source.

19. The device according to claim 18, wherein the coating source includes at least one of a source vaporizing a layer material or a sputter cathode source sputtering the layer material, wherein the coating source is arranged in a vacuum-coating chamber.

20. A device according to claim 18, having a first constant spacing from the coating source to the substrates to be coated during the first coating phase, and a second constant spacing from the coating source to the substrates to be coated during the second coating phase.

21. The device according to claim 20, wherein the first and second constant spacings between the coating source and the substrates to be coated are adjusted, whereby a vaporized and/or sputtered layer material from the coating source is deposited essentially exclusively on the substrates.

22. The device according to claim 18, wherein the substrates are held during the first and second coating phases on the transport belt so as to rotate about their cylindrical longitudinal axes, whereby the substrates are coated uniformly around their cylindrical side surfaces.

23. A method for coating a plurality of cylindrical substrates, comprising:

providing a first coating source which produces a first material cloud;

providing a second coating source which produces a second material cloud;

moving a first substrate to be coated through the first material cloud in a first orientation with respect to the first coating source such that a portion of a cylindrical lateral surface of the first substrate is coated with material from the first material cloud;

moving the first substrate through the second material cloud in the first orientation such that a portion of the cylindrical lateral surface of the first substrate is coated with material from the second material cloud;

moving a second substrate to be coated through the first material cloud in the first orientation such that a portion of a cylindrical lateral surface of the second substrate is coated with material from the first material cloud;

moving the second substrate through the second material cloud in the first orientation such that a portion of the cylindrical lateral surface of the second substrate is coated with material from the second material cloud;

moving the first substrate through the second material cloud in a second orientation with respect to the second coating source such that a cylinder bottom surface of the first substrate is coated with material from the second material cloud;

moving the first substrate through the first material cloud in the second orientation such that the cylinder bottom surface of the first substrate is coated with material from the first material cloud;

moving the second substrate through the second material cloud in the second orientation such that a cylinder bottom surface of the second substrate is coated with material from the second material cloud; and moving the second substrate through the first material cloud in the second orientation such that the cylinder bottom surface of the second substrate is coated with material from the first material cloud, wherein the first orientation differs from the second orientation.

24. A device for coating a plurality of cylindrical substrates, comprising:

a coating chamber;

a first coating source arranged in the coating chamber, wherein the first coating source produces a first material cloud;

a second coating source arranged in the coating chamber, wherein the second coating source produces a second material cloud;

a transport device for transporting a plurality of substrates through the coating chamber, wherein the transport device moves a first substrate to be coated: (a) through the first material cloud in a first orientation with respect to the first coating source such that a portion of a cylindrical lateral surface of the first substrate is coated with material from the first material cloud, (b) through the second material cloud in the first orientation such that a portion of the cylindrical lateral surface of the first substrate is coated with material from the second material cloud, (c) through the second material cloud in a second orientation with respect to the second coating source such that a cylinder bottom surface of the first substrate is coated with material from the second material cloud, and (d) through the first material cloud in the second orientation such that the cylinder bottom surface of the first substrate is coated with material from the first material cloud; and wherein the transport device moves a second substrate to be coated: (a) through the first material cloud in the first orientation such that a portion of a cylindrical lateral surface of the second substrate is coated with material from the first material cloud, (b) through the second material cloud in the first orientation such that a portion of the cylindrical lateral surface of the second substrate is coated with material from the second material cloud, (c) through the second material cloud in the second orientation such that a cylinder bottom surface of the second substrate is coated with material from the second material cloud, and (d) through the first material cloud in the second orientation such that the cylinder bottom surface of the second substrate is coated with material from the first material cloud, and wherein the first orientation differs from the second orientation.

* * * * *